(12) United States Patent
Kim et al.

(10) Patent No.: US 6,897,793 B1
(45) Date of Patent: May 24, 2005

(54) METHOD AND APPARATUS FOR RUN LENGTH LIMITED TMDS-LIKE ENCODING OF DATA

(75) Inventors: Gyudong Kim, Sunnyvale, CA (US); Hoon Choi, Mountain View, CA (US); Min-Kyu Kim, Sunnyvale, CA (US); Daeyun Shim, Cupertino, CA (US)

(73) Assignee: Silicon Image, Inc., Sunnyvale, CA (US)

( * ) Notice: Subject to any disclaimer, the term of this patent is extended or adjusted under 35 U.S.C. 154(b) by 0 days.

(21) Appl. No.: 10/835,301

(22) Filed: Apr. 29, 2004

(51) Int. Cl.$^7$ ............................................. H03M 7/00
(52) U.S. Cl. ............................ 341/59; 341/50; 341/67
(58) Field of Search ............................... 341/59, 67, 50; 375/242; 714/782, 756, 758, 752; 360/40

(56) References Cited

U.S. PATENT DOCUMENTS

| | | | | |
|---|---|---|---|---|
| 4,811,361 A | * | 3/1989 | Bacou et al. | 375/242 |
| 5,150,211 A | | 9/1992 | Charbonnel et al. | 358/143 |
| 5,199,030 A | | 3/1993 | Ueda | 370/68 |
| 5,220,568 A | * | 6/1993 | Howe et al. | 714/782 |
| 5,392,299 A | * | 2/1995 | Rhines et al. | 714/756 |
| 5,506,932 A | | 4/1996 | Holmes et al. | 395/2.14 |
| 5,523,795 A | | 6/1996 | Ueda | 348/480 |
| 5,541,662 A | | 7/1996 | Adams et al. | 348/460 |
| 5,625,644 A | * | 4/1997 | Myers | 375/242 |
| 5,905,769 A | | 5/1999 | Lee et al. | 375/376 |
| 5,940,070 A | | 8/1999 | Koo | 345/302 |
| 5,974,464 A | | 10/1999 | Shin et al. | 709/231 |
| 6,052,072 A | * | 4/2000 | Tsang et al. | 341/59 |
| 6,191,822 B1 | | 2/2001 | Smyers | 348/552 |
| 6,198,582 B1 | * | 3/2001 | Tsang et al. | 360/40 |
| 6,204,781 B1 | * | 3/2001 | Aziz et al. | 341/59 |
| 6,208,715 B1 | | 3/2001 | Haavisto | 379/88.07 |
| 6,249,669 B1 | | 6/2001 | Ogino et al. | 455/63 |
| 6,288,655 B1 | * | 9/2001 | Tsang et al. | 341/59 |
| 6,480,125 B2 | * | 11/2002 | Rub et al. | 341/50 |
| 6,504,493 B1 | * | 1/2003 | Burd | 341/50 |
| 6,543,023 B2 | * | 4/2003 | Bessios | 714/758 |
| 6,804,805 B2 | * | 10/2004 | Rub | 714/752 |

FOREIGN PATENT DOCUMENTS

WO    WO 00/16525    3/2000    ........... H04L/25/02

OTHER PUBLICATIONS

Lieberman, David "*PC Video Interface Looks to Add Audio Capability*", *EE Times* (Mar. 26, 2001, 11:57 a.m. EST), pp. 1–3, downloaded from the Internet on May 23, 2001 from http://www.eetimes.com/story/OEG20010326S0029.

Silicon Image, Inc., "*Silicon Image First to Couple Digital Audio and Video on the DVI Link*", Sunnyvale, Jan. 16, 2001, pp. 1–4, downloaded from the Internet on May 22, 2001 from http://www.siimage.com/press/01_16_01.asp.

Silicon Image, Inc., "*CE Industry Heavyweights Proclaim DVI HDCP as the Interface for HDTV–Further Propelling Silicon Image into the CE Space*", Las Vegas, Jan. 4, 2001, pp. 1–4, downloaded from the Internet on May 22, 2001 from http://www.siimage.com/press/01_04_01a.asp.

\* cited by examiner

*Primary Examiner*—Jean Bruner Jeanglaude
(74) *Attorney, Agent, or Firm*—Girard & Equitz LLP

(57) ABSTRACT

A serial data transmission system in which a transmitter encodes data in accordance with a TMDS-like encoding algorithm and transmits the TMDS-like encoded data over a serial link to a receiver. The encoded data are transmitted as a run length limited ("RLL") code word sequence, including transition-minimized code words. In some embodiments, the RLL code word sequence includes only Min words, including both DC balancing Min words and DC unbalancing Min words. In other embodiments, the RLL code word sequence includes both transition-maximized code words and transition-minimized code words. Other aspects of the invention are circuitry and methods for TMDS-like encoding of data for transmission as an RLL code word sequence.

53 Claims, 5 Drawing Sheets

METHOD AND APPARATUS FOR RUN LENGTH LIMITED TMDS-LIKE ENCODING OF DATA

TECHNICAL FIELD OF THE INVENTION

The invention pertains to transmission of encoded data (e.g., video data and/or audio data) over a serial link, in such a manner as to reduce the bit error rate resulting from inter-symbol interference or other error-causing effects during transmission. In some embodiments, the serial link is a transition minimized differential signaling ("TMDS") link, or a link having some but not all of the characteristics of a TMDS link.

BACKGROUND OF THE INVENTION

Elements of this invention are based upon properties of a serial link. Various serial links for transmitting data and clock signals are well known.

One conventional serial link, used primarily for high-speed transmission of video data from a host processor (e.g., a personal computer) to a monitor, is known as a transition minimized differential signaling ("TMDS") interface (sometimes referred to as a TMDS link). The characteristics of a TMDS link include the following:

1. video data are encoded and then transmitted as encoded words (each 8-bit word of digital video data is converted to an encoded 10-bit word before transmission);
   a. the encoding determines a set of "in-band" words and a set of "out-of-band" words (the encoder can generate only "in-band" words in response to video data, although it can generate "out-of-band" words in response to control or sync signals. Each in-band word is an encoded word resulting from encoding of one input video data word. All words transmitted over the link that are not in-band words are "out-of-band" words);
   b. the encoding of video data is performed such that the in-band words are transition minimized (a sequence of in-band words has a reduced or minimized number of transitions);
   c. the encoding of video data is performed such that the in-band words are DC balanced (the encoding prevents each transmitted voltage waveform that is employed to transmit a sequence of in-band words from deviating by more than a predetermined threshold value from a reference potential. Specifically, the tenth bit of each "in-band" word indicates whether eight of the other nine bits thereof have been inverted during the encoding process to correct for an imbalance between running counts of ones and zeroes in the stream of previously encoded data bits);
2. the encoded video data and a video clock signal are transmitted as differential signals (the video clock and encoded video data are transmitted as differential signals over conductor pairs);
3. three conductor pairs are employed to transmit the encoded video, and a fourth conductor pair is employed to transmit the video clock signal; and
4. signal transmission occurs in one direction, from a transmitter (typically associated with a desktop or portable computer, or other host) to a receiver (typically an element of a monitor or other display device).

A use of the TMDS serial link is the "Digital Visual Interface" interface ("DVI" link) adopted by the Digital Display Working Group. A transmitter that complies with the Digital Visual Interface standard, Revision 1.0, Apr. 2, 1999 (the "DVI specification") will sometimes be referred to herein as a "DVI" transmitter, a receiver that complies with the DVI specification will sometimes be referred to herein as a "DVI" receiver, and a system that complies with the DVI specification will sometimes be referred to herein as a "DVI" system.

A DVI system, and aspects of the DVI specification, will be described with reference to FIG. 1. A DVI system can be implemented to include two TMDS links (which share a common conductor pair for transmitting a video clock signal) or one TMDS link, as well as additional control lines between the transmitter and receiver. The DVI system of FIG. 1 includes DVI transmitter 1, DVI receiver 3, and the following conductors between the transmitter and receiver: four conductor pairs (Channel 0, Channel 1, and Channel 2 for video data, and Channel C for a video clock signal), Display Data Channel ("DDC") lines for bidirectional communication between the transmitter and a monitor associated with the receiver in accordance with the conventional Display Data Channel standard (the Video Electronics Standard Association's "Display Data Channel Standard," Version 2, Rev. 0, dated Apr. 9, 1996), a Hot Plug Detect (HPD) line (on which the monitor transmits a signal that enables a processor associated with the transmitter to identify the monitor's presence), Analog lines (for transmitting analog video to the receiver), and Power lines (for providing DC power to the receiver and a monitor associated with the receiver). The Display Data Channel standard specifies a protocol for bidirectional communication between a transmitter and a monitor associated with a receiver, including transmission by the monitor of an Extended Display Identification ("EDID") message that specifies various characteristics of the monitor, and transmission by the transmitter of control signals for the monitor. DVI transmitter 1 includes three identical encoder/serializer units (units 2, 4, and 6) and additional circuitry (not shown). DVI receiver 3 includes three identical recovery/decoder units (units 8, 10, and 12) and inter-channel alignment circuitry 14 connected as shown, and additional circuitry (not shown). Units 2, 4, and 6, perform TMDS encoding on the data to be transmitted, and units 8, 10, and 12 decode the TMDS-encoded data after transmission.

As shown in FIG. 1, circuit 2 encodes the data to be transmitted over Channel 0, and serializes the encoded bits. Similarly, circuit 4 encodes the data to be transmitted over Channel 1 (and serializes the encoded bits), and circuit 6 encodes the data to be transmitted over Channel 2 (and serializes the encoded bits). Each of circuits 2, 4, and 6 responds to a control signal (an active high binary control signal referred to as a "data enable" or "DE" signal) by selectively encoding either digital video words (in response to DE having a high value) or a control or synchronization signal pair (in response to DE having a low value). Each of encoders 2, 4, and 6 receives a different pair of control or synchronization signals: encoder 2 receives horizontal and vertical synchronization signals (HSYNC and VSYNC); encoder 4 receives control bits CTL0 and CTL1; and encoder 6 receives control bits CTL2 and CTL3. Thus, each of encoders 2, 4, and 6 generates in-band words indicative of video data (in response to DE having a high value), encoder 2 generates out-of-band words indicative of the values of HSYNC and VSYNC (in response to DE having a low value), encoder 4 generates out-of-band words indicative of the values of CTL0 and CTL1 (in response to DE having a low value), and encoder 6 generates out-of-band words indicative of the values of CTL2 and CTL3 (in response to DE having a low value). In response to DE having a low value, each of encoders 4 and 6 generates one of four specific out-of-band words indicative of the values 00, 01, 10, or 1, respectively, of control bits CTL0 and CTL1 (or CTL2 and CTL3).

In operation of the FIG. 1 system, cable 23 (comprising connectors 20 and 21 and conductors 22) is connected between transmitter 1 and receiver 3. Conductors 22 include a conductor pair for transmitting serialized data over Channel 0 from encoder 2 to decoder 8, a conductor pair for transmitting serialized data over Channel 1 from encoder 4 to decoder 10, a conductor pair for transmitting serialized data over Channel 2 from encoder 6 to decoder 12, and a conductor pair for transmitting a video clock over Channel C from transmitter 1 to receiver 3. Conductors 22 also include wires for the DDC channel (which can be used for bidirectional 12C communication between transmitter 1 and receiver 3), a Hot Plug Detect (HPD) line, "Analog" lines for analog video transmission from transmitter 1 to receiver 3, and "Tower" lines for provision of power from transmitter 1 to a receiver 3.

In receiver 3, the data signal received on Channel 0 is sampled in unit 8 and the samples are deserialized and decoded. The data signal received on Channel 1 is sampled in unit 10 and the samples are deserialized and decoded. The data signal received on Channel 2 is sampled in unit 12 and the samples are deserialized and decoded. The decoded samples are indicative of recovered data, control, and sync bits, and the decoded bits are asserted to inter-channel alignment circuitry 14.

Throughout the specification (including in the claims), the expression "TMDS-like encoding" of data for transmission over a serial link will be used to denote TMDS encoding and other encoding in which N-bit words of data (e.g., video data) are encoded as M-bit code words, where M is greater than N (e.g., N=8, M=10, and each 8-bit input word is encoded as a 10-bit code word before transmission); and each code word is either a "transition-minimized" code word or a "transition-maximized" code word, each transition-minimized code word having less than a predetermined number of transitions between consecutive bits thereof, and each transition-maximized code word having more than the predetermined number of transitions between consecutive bits thereof. A transition-maximized code word will sometimes be denoted herein as a "Max" word. A transition-minimized code word will sometimes be denoted herein as a "Min" word. Encoded data that have been encoded in accordance with "TMDS-like encoding" will be referred to herein as "TMDS-like encoded data."

In a binary bit stream (e.g., a sequence of serially-transmitted binary bits indicated by a data signal), there are "runs" of consecutive "zero" bits and/or "runs" of consecutive "one" bits. The runs typically do not all have the same length. We use the expression "maximum run length" herein to denote the length of the longest run (of identical bits) in a data signal that is indicative of a binary bit sequence. For example, a stream of serially-transmitted data has a maximum run length of 7 if it has runs (of identical bits) of length 7 or less, but no run (of identical bits) of length greater than 7.

We use the expression "average run length" herein to denote the average length of all runs in a data signal that is indicative of a binary bit sequence.

Long run length causes severe inter-symbol interference (ISI) in long cable high-speed serial communication. In transmission of transition-minimized TMDS-encoded data (during active video periods), the low number of transitions results in longer run length than in transmission of transition-maximized TMDS-encoded data (during blanking intervals). Although maximum run length is controlled and limited by the DC balancing implemented by TMDS encoding, conventional TMDS encoding cannot reliably reduce ISI to acceptable levels in at least some high frequency applications (i.e., applications with high data rate) and in at least some cases in which TMDS-encoded data are transmitted over long cable interconnects.

Preferred embodiments of the present invention employ an improved version of TMDS encoding that is still compatible with legacy TMDS receivers, and reduces maximum run length (and average run length) significantly to reduce ISI, even in very high frequency applications and applications in which the encoded data are transmitted over long cables.

SUMMARY OF THE INVENTION

In a class of embodiments, the invention is a serial data transmission system including a transmitter, a receiver, and a serial link (e.g., a TMDS link) between the transmitter and receiver. The transmitter is configured to encode data (e.g., video data or audio data) in accordance with a TMDS-like encoding algorithm and to transmit the TMDS-like encoded data, as a run length limited ("RLL") code word sequence including transition-minimized code words ("Min" words), over the serial link to the receiver. The receiver is configured to decode the transmitted data. In some embodiments, the RLL code word sequence includes only Min words, but includes both DC balancing Min words and DC unbalancing Min words. In other embodiments, the RLL code word sequence includes both transition-maximized code words ("Max" words) and Min words (the Min words can consist of DC balancing Min words only, or can include DC unbalancing Min words as well as DC balancing Min words). Typically, the transmitter is configured to transmit the RLL code word sequences during active data periods (e.g., intervals in which a data enable control bit, "DE," is high) and to transmit transition-maximized control characters at times other than during active data periods (e.g., during intervals in which the control bit "DE" is low). Other aspects of the invention are transmitters and encoding circuitry for use in (and methods for) TMDS-like encoding of data for transmission as an RLL code word sequence.

The inventive TMDS-like encoding algorithm encodes data (for transmission over a serial link) as an RLL code word sequence consisting of transition-minimized code words, or including both transition-minimized code words and transition-maximized code words. The encoding prevents the RLL code word sequence from including a run of length in excess of a predetermined value. In some preferred embodiments, the inventive TMDS-like encoding algorithm is an improved version of a conventional encoding algorithm, and the encoded data generated in accordance with the invention can be decoded by conventional decoders (sometimes referred to herein as "legacy" decoders) that are capable of implementing the inverse of the conventional encoding algorithm to decode the encoded data. For example, in some preferred embodiments the inventive TMDS-like encoding algorithm is an improved version of the conventional TMDS encoding algorithm, and the encoding is accomplished such that the encoded data can be decoded by a conventional TMDS decoder in a conventional TMDS receiver (sometimes referred to as a "legacy" receiver).

During transmission of conventional TMDS encoded data, transmission of transition-minimized code words ("Min" words) rather than transition-maximized code words ("Max" words) reduces emission power, but increases the maximum run length and average run length in the transmitted data stream, thereby causing significant inter-symbol interference (ISI) problems in some applications (e.g., in very high frequency applications and applications in which the encoded data are transmitted over long cables). In preferred embodiments, the invention solves this problem by performing TMDS-like encoding in a manner that results in shorter maximum run length (and average run length) than is attainable with conventional encoding, thus significantly reducing ISI even in very high frequency applications and applications in which the encoded data are transmitted over long cables.

In a class of embodiments, the invention is a transmitter configured to encode data in accordance with a TMDS-like encoding algorithm and to transmit the encoded data over a serial link. Encoding circuitry in the transmitter is operable to encode a sequence of input data words as a sequence of Min words unless the encoded data stream (sequence of code word bits) would have a run length that exceeds a predetermined value. In response to determining that a candidate Min word (indicative of input data) concatenated with at least one bit of the previously generated encoded data stream (e.g., a small number of the most recently generated encoded data bits) would include a run of excessive length, the encoding circuitry includes a Max word that corresponds to the candidate Min word) as the next code word of the encoded data stream in place of the candidate Min word. The resulting encoded data stream is an RLL code word sequence that includes no run of length in excess of the predetermined value. In typical embodiments, the encoding circuitry includes circuitry for generating both a candidate Min word and a corresponding Max word for each input data word, logic for determining the run length of at least one bit of the previously encoded data stream concatenated with the candidate Min word, and logic configured to insert either the candidate Min word or the corresponding Max word in the encoded data stream (the RLL code word sequence to be transmitted) to avoid a run length in the transmitted encoded data that exceeds the predetermined value.

Thus, in the transmitted RLL code word sequence, either a Min word or a Max word corresponding thereto is indicative of each input word. Preferably, each Max word inserted in the RLL code word sequence has a bit pattern such that the Max word can be decoded by simple decoding circuitry (e.g., simple decoding logic configured to decode a sequence of Min words) that generates the same decoded word in response either to the Max word or the Min word corresponding to the Max word. For example, assume that decoding logic in a receiver is configured to decode an encoded data stream consisting of a sequence of Min words only, to recover a corresponding sequence of input data words. Preferably, the inventive encoder generates an RLL code word sequence (comprising both Max words and Min words) corresponding to the Min word sequence (i.e., a code word sequence that is indicative of the same sequence of input data as is the Min word sequence) in such a manner that the decoding logic will recover the same decoded word sequence in response to either the Min word sequence or the RLL code word sequence (comprising both Max words and Min words) corresponding thereto. In preferred embodiments, the decoding logic is configured to recover the same decoded word in response to either a Max word (in an RLL code word sequence comprising both the Max word and at least one Min word) or the Min word corresponding to such Max word.

In preferred embodiments, the inventive transmitter is a DVI transmitter configured to encode data in accordance with a TMDS-like encoding algorithm and to transmit the encoded data. The encoding circuitry is operable in a mode in which it implements conventional TMDS encoding to encode input words as Min words when the resulting encoded data stream does not include a run length that exceeds a predetermined value. The encoding circuitry is configured to determine when the conventional TMDS encoding would result in a run length (in the encoded data stream) that exceeds the predetermined value, and upon determining that a candidate Min word (indicative of input data) concatenated with at least one bit of a previously generated encoded data stream would include a run of excessive length, to include a Max word (that corresponds to the Min word) as the next code word of the encoded data stream (in place of the candidate Min word). The resulting encoded data stream is an RLL code word sequence that includes no run of length in excess of the predetermined value. Such a DVI transmitter preferably generates each Max word that it includes in an RLL code word sequence (that comprises both the Max word and at least one Min word) in such a manner that the DVI transmitter can be used with a conventional DVI receiver (e.g., one including multiple decoders, each decoder having a decoder architecture of the type described in the DVI specification). Such conventional decoder architecture has a redundancy in the sense that it passes through decoding logic (including XNOR or XOR gates) each 10-bit code word received, regardless of whether the 10-bit code word is a Max word or a Min word, so that the decoded word output from the decoding logic can be selected when DE=1. In the case that DE=0, the output of the decoding logic is not selected, and instead one of four control words (generated by other circuitry within the decoder in response to the received 10-bit code words) is selected. By taking advantage of this redundancy, preferred embodiments of the invention reduce the maximum run length (and average run length) in the transmitted encoded data by scattering Max words among Min words in the transmitted encoded data (e.g., when DE=1), while allowing use of a conventional DVI receiver to decode the encoded data. In such preferred embodiments, the decoding logic in the receiver is configured to recover the same decoded word in response to either a Max word (in an RLL code word sequence comprising both the Max word and at least one Min word) or the Min word corresponding to such Max word. Because the decoder will decode the correct data regardless of whether each received code word is transition minimized or not, a legacy receiver (designed to be compatible with a conventional DVI transmitter) that includes the decoder will be compatible with transmitters that embody the invention.

In various embodiments of the invention, different techniques are employed to insert Max words into an RLL code word sequence that also includes Min words. One easily-implementable technique is for the encoder to count trailing run length as follows. The encoder determines whether the leading bit (e.g., the least significant bit or "LSB") of the current candidate Min word (generated in response to the current input data word) matches (i.e., has the same polarity as) the trailing bit of the previously generated code word, and whether the last X bits (e.g., the X most significant bits) of the previously generated code word are identical (where "X" is an integer that is a predetermined threshold value, e.g., X=6), thereby determining whether the two-word sequence (the previously generated code word and current candidate Min word) has a run length that exceeds X. In response to determining that the leading bit of the current candidate Min word matches the trailing bit (e.g., the MSB) of the previous code word and that the last X bits (e.g., the X most significant bits) of the previous code word are identical, the encoder encodes the current input data word as a Max word that corresponds to the current candidate Min word (i.e., inserts the Max word into the encoded data stream rather than the corresponding Min word).

Variations on the technique (described in the previous paragraph) of counting trailing run length reduce the average number of Max words that are inserted in typical encoded data streams by using a more sophisticated algorithm, e.g., an algorithm that allows longer average run length in each encoded data stream. For example, in some embodiments the encoder is configured to count multiple leading bits of the current candidate Min word (generated in response to the current input data word) as well as multiple trailing bits of the previous code word (the code word generated in response to the previous input data word). More specifically, in response to determining that the leading bit of the current candidate Min word has the same polarity as the trailing bit of the previous code word and that the first Y bits of the current candidate Min word and the last X bits of the previous code word are identical (where "Y" and "X" are integers, and "Y" is greater than one), the encoder encodes the current input data word as a Max word that corresponds to the current candidate Min word (i.e., inserts the Max word into the encoded data stream rather than the corresponding candidate Min word). In this case, the encoder allows longer maximum run length (maximum run length of Y+X−1) than in the example described in the previous paragraph (which allows maximum run length of X), assuming that X has the same value in both cases. As a result, Max words are used less frequently to encode input words.

Another method of limiting run length in accordance with the invention exploits the redundancy of DC balancing in some TMS-like encoding algorithms (e.g., the conventional TMDS encoding algorithm, which inserts either a Min word or a complemented version of the Min word in the encoded data stream as needed to achieve DC balancing, where the complemented version of each Min word includes a bit sequence which is the complement of a corresponding bit sequence in the Min word). For example, in some embodiments, the invention is a transmitter configured to encode data in accordance with a TMDS-like encoding algorithm and to transmit the encoded data, and includes encoding circuitry operable in a mode in which it encodes input words as a DC-balanced sequence of Min words (including Min words and complemented Min words, each complemented Min word having a subset of bits that is the complement of a corresponding subset of a corresponding one of the Min words) unless the resulting encoded data stream (sequence of code word bits) would have a run length that exceeds a predetermined value. In response to the current input data word, the encoder determines a candidate Min word (indicative of the current input data word) such that the candidate Min word concatenated with the previously generated encoded data stream has correct DC balancing (the candidate Min word will sometimes be referred to herein as a "DC balancing" Min word). The encoder then determines whether the candidate Min word concatenated with the previously generated encoded data stream would include a run of excessive length. In response to determining that the candidate Min word concatenated with the previously generated encoded data stream includes a run of excessive length, the encoding circuitry does not encode the current input data word as the current candidate Min word, and instead encodes the current input data word as another Min word (to be referred to herein as a "DC unbalancing" Min word) at least some of whose bits (e.g., the "Z" least significant bits thereof) are the complements of corresponding bits of the current candidate Min word. The encoder includes the DC unbalancing Min word as the next code word of the encoded data stream (in place of the candidate Min word). Thus, the encoder generates an RLL code word sequence that includes no run of length in excess of the predetermined value for transmission. The transmitted encoded data stream includes code words having the "wrong" DC balancing, and thus can have DC disparity larger than would result with conventional TMDS encoding, but its maximum and average run length is reduced without the need to include Max words in the encoded data stream. In some embodiments of the invention, the maximum DC disparity of such an encoded data stream is limited (at the cost of increasing the maximum allowed run length in the encoded data stream).

In conventional TMDS encoding, an 8-bit input word is encoded by generating a 9-bit code word portion indicative of the input word, such that the MSB of the 9-bit code word portion indicates the specific algorithm employed to generate the other eight bits thereof. Then, the 8 LSBs of the 9-bit code word portion are either inverted or left unchanged as necessary to achieve DC balancing, and a 10-bit code word (a Min word) is generated by concatenating a $10^{th}$ bit with the resulting modified (or unchanged) 9-bit code word portion, such that the $10^{th}$ bit is the MSB of the resulting 10-bit Min word and indicates whether or not the eight LSBs of the Min word were or were not inverted during encoding. In some embodiments of the invention, conventional TMDS encoding is modified as described in the preceding paragraph, so that in response to determining that a current candidate Min word concatenated with a previously generated encoded data stream includes a run of excessive length, the encoding circuitry does not encode the current input data word as the conventionally-determined current candidate Min word, and instead encodes the current input data word as a "DC unbalancing" Min word whose eight least significant bits are the complements of the eight least significant bits of the conventionally-determined current candidate Min word.

In typical embodiments of the class discussed in the two preceding paragraphs, the substitution of DC unbalancing Min words for conventionally determined Min words (having correct DC balancing) is implemented by circuitry for generating both a candidate DC balancing Min word (having the correct polarity to achieve or improve DC balancing) and a corresponding DC unbalancing Min word (some or all of whose bits are the complements of corresponding bits of the DC balancing Min word) for each input data word; and logic configured to insert either the candidate DC balancing Min word or the DC unbalancing Min word in the encoded data stream (the RLL code word sequence to be transmitted) to avoid a run length in the transmitted encoded data that exceeds a predetermined value. Thus, in the transmitted RLL code word sequence, either a DC balancing Min word or a DC unbalancing Min word is indicative of each input word. Preferably, the inventive encoder generates an RLL code word sequence (comprising both DC balancing Min words and DC unbalancing Min words) that corresponds to a conventionally generated sequence of DC balancing Min words (i.e., indicative of the same sequence of input data as is the sequence of DC balancing Min words) in such a manner that conventional decoding logic will recover the same decoded word sequence in response to either the conventionally generated sequence of DC balancing Min words only or the RLL code word sequence (comprising both DC balancing Min words and DC unbalancing Min words) corresponding thereto. For example, in preferred embodiments, the decoding logic is configured to recover the sane decoded word in response to either a DC unbalancing Min word (in an RLL code word sequence comprising both the DC unbalancing Min word and at least one DC balancing Min word) or the DC balancing Min word corresponding to such DC unbalancing Min word.

RLL code word sequences generated in accordance with some embodiments of the invention include both "DC unbalancing" and "DC balancing" Min words, and Min and Max words. The mix of DC balancing (inclusion of "DC unbalancing" Min words in place of "DC balancing" Min words) and transition control (inclusion of Max words in place of "DC balancing" Min words) is preferably determined to be optimal for the specific application. When mode conversion is critical, it is preferable to minimize the use of Max words (and to maximize the use of "DC unbalancing" Min words) in the transmitted RLL code word sequence. However, this would result in loose control of DC disparity. If maintaining DC level is important, the trade-off should be done in a different way.

In a class of embodiments, the invention is a TMDS-like encoding method for generating a code word sequence of M-bit code words by encoding N-bit data words of a data word sequence, where M>N, said method including the steps of: generating a sequence of candidate code words, including by generating an M-bit, transition-minimized candidate code word in response to each N-bit data word of the data word sequence; and generating the code word sequence using the candidate code words, including by determining whether a current candidate code word (e.g., the most recently generated candidate code word) concatenated with at least one previously generated bit of the code word sequence includes a run of length in excess of a predetermined value, including the current candidate code word in the code word sequence in response to determining that the current candidate code word concatenated with said at least one previously generated bit of the code word sequence includes no run of length in excess of the predetermined value, and including an M-bit substitute code word that corresponds to the current candidate code word in the code word sequence rather than the current candidate code word in response to determining that the current candidate code word concatenated with the at least one previously generated bit of the code word sequence includes a run of length in excess of the predetermined value, whereby the code word sequence is a run length limited code word sequence including no run of length in excess of the predetermined value. In some such embodiments, each candidate code word is a DC balancing word, and each substitute code word that corresponds to one said candidate code word is a transition-minimized DC unbalancing word including a bit sequence which is the complement of a corresponding bit sequence in the candidate code word to which the DC unbalancing word corresponds. In other embodiments in this class, each substitute code word is a transition-maximized code word and each candidate code word is a transition-minimized code word.

In another class of embodiments, the invention is a method for data transmission over a serial link to a receiver, wherein the receiver is configured to recover data from a signal that has propagated over the link to said receiver, the signal is indicative of encoded data that have been generated by encoding data in accordance with a TMDS-like encoding algorithm having an inverse, and the receiver is configured to recover the data from the signal including by decoding the encoded data in accordance with the algorithm's inverse, said method including the steps of: generating a code word sequence of M-bit code words by encoding N-bit data words of a data word sequence in accordance with a modified version of the algorithm, where M>N, including by generating M-bit, transition-minimized candidate code words in response to the data words in accordance with the algorithm and substituting M-bit substitute code words for selected ones of the candidate code words in accordance with the modified version of the algorithm such that the code word sequence is a run length limited code word sequence including no run of length in excess of a predetermined value; and transmitting a run length limited signal indicative of the code word sequence over the link to the receiver, wherein the modified version of the algorithm is such that the receiver is capable of recovering the data words from the run length limited signal including by decoding the code word sequence in accordance with the inverse of the algorithm. In some such embodiments, each candidate code word is a DC balancing word, and each substitute code word that corresponds to one said candidate code word is a transition-minimized DC unbalancing word including a bit sequence which is the complement of a corresponding bit sequence in the candidate code word to which the DC unbalancing word corresponds. In other embodiments in this class, each of the substitute code words is a transition-maximized code word and each candidate code word is a transition-minimized code word.

In another class of embodiments in which multiple code word sequences are generated (e.g., each for transmission over a different channel) maximum run length is controlled in some (e.g., most) but not all of the code word sequences. Runs in excess of the maximum run length are allowed in at least one of the sequences. In other embodiments of the invention, maximum run length is controlled intermittently in a code word sequence (or in each of some or all of a number of code word sequences). For example, a run length limited code word sequence is generated, followed by a non-run length limited bit sequence, followed by another run length limited code word sequence, and so on. In any of the embodiments mentioned in this paragraph, bit error at the receiver side can potentially occur due to excessive ISI. However, in some applications such error is acceptable. For example, infrequent and random bit error in image data is typically not noticeable to human eyes (e.g., a pixel error rate of $10^{-6}$ is not generally noticeable to untrained human eyes). Preferably, the embodiments mentioned in this paragraph will be employed only in cases in which a bit error in a code word sequence would not propagate to subsequent code words in the sequence in the decoding process. TMDS-like encoding can be implemented in accordance with the embodiments mentioned in this paragraph since bit errors are not propagated in such embodiments. When implementing other encoding (in accordance with such embodiments) in which bit errors can be propagated, the pixel error ramification should be carefully addressed.

DETAILED DESCRIPTION OF THE PREFERRED EMBODIMENTS

In some embodiments, TMDS-like encoded data are transmitted in accordance with the invention over a TMDS link. In other embodiments, TMDS-like encoded data are transmitted in accordance with the invention over a serial link that is not a TMDS link (e.g., a serial link that is not a TMDS link but is capable of transmitting encoded digital video data, and optionally also a clock for the encoded digital video data and one or more additional signals (e.g., encoded digital audio data or other encoded data), from a transmitter to a receiver. The data transmitted in accordance with the invention can, but need not, be transmitted differentially (over a pair of conductors). Also, although a TMDS link has four differential pairs (in the single pixel version), three for video data and the other for a video clock, encoded data can be transmitted in accordance with the invention over a serial link having a different number of conductors or conductor pairs.

The term "channel," as used herein, refers to that portion of a serial link that is employed to transmit data (e.g., a particular conductor or conductor pair between the transmitter and receiver over which the data are transmitted, and specific circuitry within the transmitter and/or receiver used for transmitting and/or recovery of the data) and to the technique employed to transmit the data over the link.

The term "transmitter" is used herein in a broad sense to denote any unit capable of encoding data and transmitting the encoded data over a serial link, and the term "receiver" is used herein in a broad sense to denote any unit capable of receiving data and decoding that has been transmitted over a serial link. For example, the term transmitter can denote a transceiver that performs the functions of a receiver as well as the functions of a transmitter.

During transmission of data over a serial link from a transmitter to a receiver, inter-symbol interference ("ISI") can give rise to errors that cause the received data to differ from the transmitted data. The rate at which such errors occur depends on such factors as the channel medium, and when the data are patterns of binary bits, the particular bit patterns that are transmitted. In accordance with the invention, data are encoded for transmission over a serial link with bit patterns that are less susceptible to ISI during transmission over the link than are the patterns determined by conventionally encoded versions of the same data. Thus, the data are transmitted more reliably in accordance with the invention, and with reduced error rate, than are conventionally encoded versions of the same data.

Encoding of data in accordance with the invention is particularly beneficial in applications in which the encoded data are transmitted over very long conductors or under other conditions in which there would otherwise be a high risk of error due to ISI during transmission.

Figure 1:
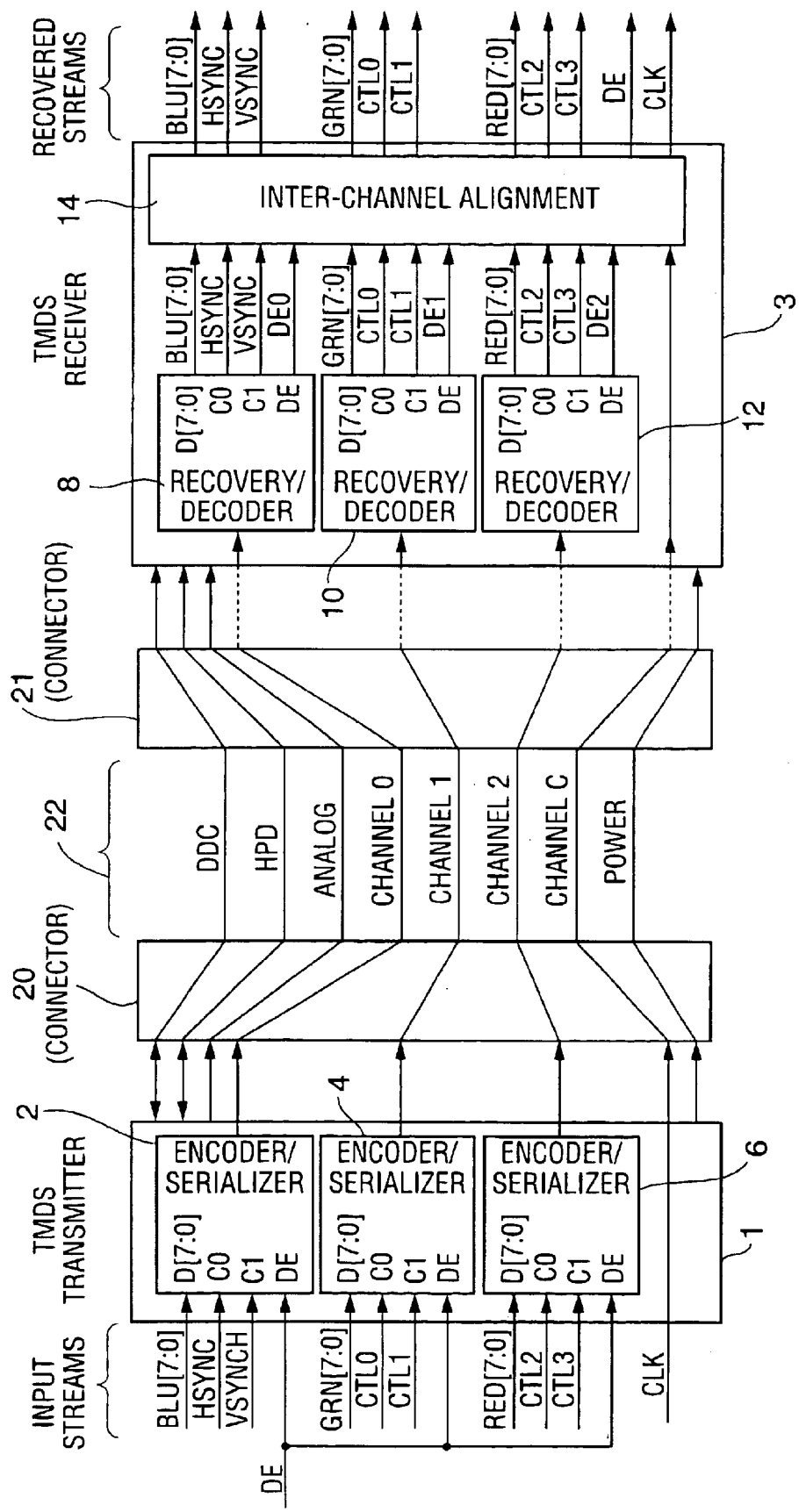
FIG. 1 is a block diagram of a conventional system including a Digital Visual Interface ("DVI") link.
Figure 2:
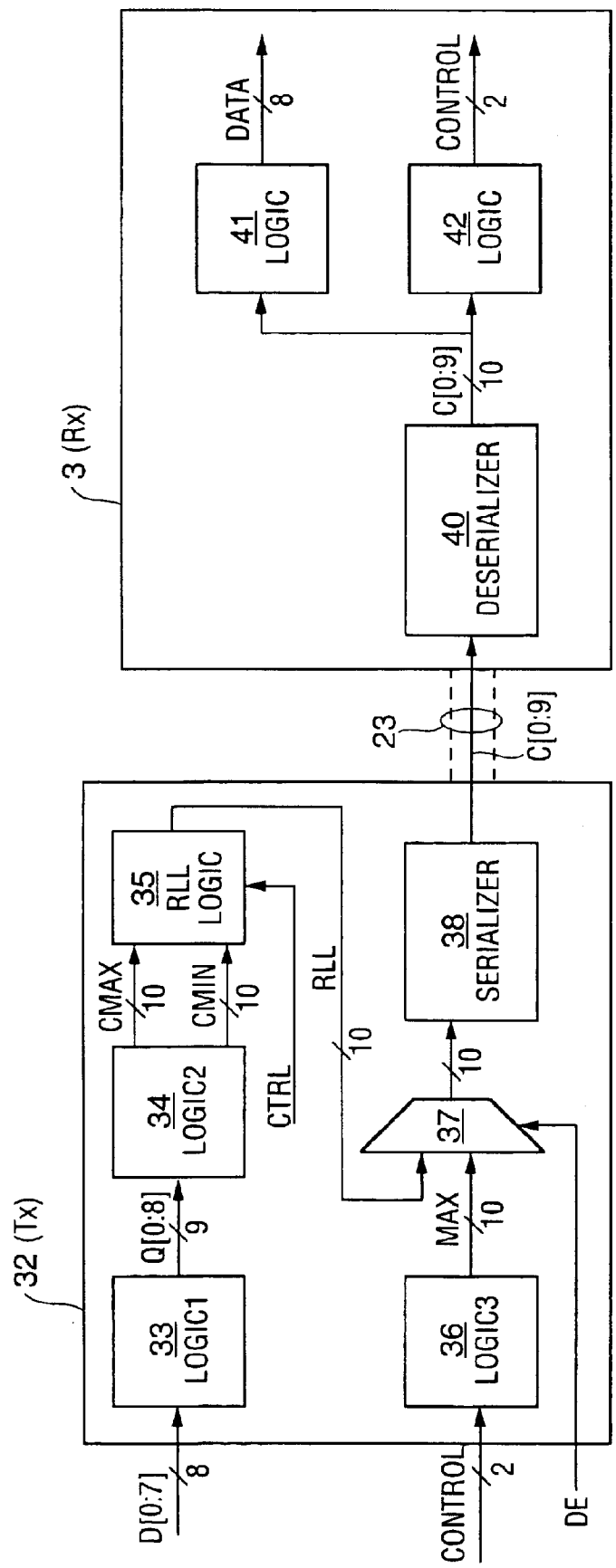
FIG. 2 is a block diagram of an embodiment of the inventive system.

We next describe an embodiment of the invention with reference to FIG. 2. In the system of FIG. 2, transmitter 32 is configured to transmit data to receiver 3 over a serial link. Receiver 3 is a conventional receiver identical to receiver 3 of FIG. 1, although a different subset of its elements are shown in FIG. 2. Cable 23 of FIG. 2 is identical to cable 23 of FIG. 1.

Within transmitter 32, conventional logic circuitry 33 encodes each 8-bit word D[0:7] of input data as a 9-bit word, Q[0:8]. Each word D[0:7] can be, for example, one of the input words "BLU[7:0]" of FIG. 1. Logic circuitry 33 is configured to perform the first stage of encoding the input word D[0:7] in accordance with the conventional TMDS encoding algorithm, to generate each word Q[0:8] by performing exclusive OR operations (or exclusive NOR operations) on the bits of the 8-bit input word, with the choice between exclusive OR operations or exclusive NOR operations depending on the number of "1" bits of the input word and on the value of its least-significant bit, D[0].

Logic circuitry 34 is configured to generate a conventional 10-bit, transition-minimized TMDS code word "CMIN" (in accordance with the conventional TMDS encoding algorithm) in response to each word Q[0:8]. This code word will be referred to herein as a "candidate" Min word for encoding the input word D[0:7]. The most significant bit, CMIN[9], of candidate Min word CMIN indicates whether the eight least-significant bits, CMIN[0:7], of CMIN have or have not been inverted in accordance with a DC balancing algorithm. The next most significant bit, CMIN[8], of candidate Min word CMIN indicates whether exclusive OR operations (or exclusive NOR operations) should be performed on bits CMIN[0:7] (or the complements of bits CMIN[0:7]) to decode these bits to recover the original input word D[0:7]. The word CMIN, like any transition-minimized 10-bit TMDS code word is "transition-minimized" in the sense that there are less than six transitions between consecutive bits thereof.

In accordance with the invention, logic circuitry 34 also generates a 10-bit, transition-maximized code word "CMAX" in response to each word Q[0:8], where the term "transition-maximized" is used with reference to FIG. 2 in the same sense as in conventional TMDS encoding and decoding. Thus, each transition-maximized code word ("Max" word) CMAX has more than six transitions between consecutive bits thereof. Logic circuitry 33 and 34 thus generate a transition-minimized TMDS code word (the candidate Min word "CMIN") and a corresponding Max word (CMAX) in response to each input word D[0:7].

Logic circuitry 34 preferably generates each word CMAX such that, if a conventional TMDS decoder performs conventional TMDS decoding on the word CMAX, the decoder will recover the same input word D[0:7] as it would in response to the candidate Min word CMIN corresponding to CMAX. Specifically, preferred implementations of logic circuitry 34 generate CMAX so that its most significant bit, CMAX[9], indicates whether its eight least-significant bits, CMAX[0:7], have or have not been inverted in accordance with a DC balancing algorithm, and such that the next most significant bit, CMAX[8], indicates whether exclusive OR operations or exclusive NOR operations should be performed on bits CMAX[0:7] (or on the complements of bits CMAX[0:7]) to decode these bits to recover the original input word D[0:7]. By performing the so-indicated exclusive OR (or exclusive NOR) operations on bits CMAX[0:7] in the manner prescribed by the conventional TMDS decoding algorithm, the decoder recovers the input word D[0:7].

RLL logic circuitry 35 receives each pair of words (candidate Min word CMIN and corresponding Max word CMAX) generated by logic circuitry 34 in response to each word Q[0:8], and passes on a selected one of these words (identified as "RLL" in FIG. 2) to a first input of multiplexer 37. RLL logic circuitry 35 is configured to determine whether the encoded data stream previously asserted therefrom to multiplexer 37 (the sequence of word RLL previously asserted from circuitry 35 to multiplexer 37) would have a run length that exceeds a predetermined value if the candidate Min word CMIN were concatenated therewith. Upon determining that the previously asserted encoded data stream, concatenated with the candidate Min word CMIN, would not have a run length exceeding the predetermined value, circuitry 35 selects the candidate Min word CMIN as the current RLL word, and passes this word on to the first input of multiplexer 37. Upon determining that the previously asserted encoded data stream, concatenated with the candidate Min word CMIN, would have a run length that exceeds the predetermined value, circuitry 35 selects the Max word CMAX as the current RLL word, and passes this word on to the first input of multiplexer 37.

In an active data mode (in which the control bit DE asserted to multiplexer 37 satisfies DE=1), multiplexer 37 passes through to serializer 38 the sequence of 10-bit RLL words received from circuitry 35. Serializer 38 serializes the bits of the words RLL and serially transmits (over one channel of cable 23) to receiver 3 a signal indicative of the serialized bits. Because the signal transmitted from serializer 38 can be indicative of different code words in different operating modes of transmitter 32, we will denote as C[0:9] the code words determined by the transmitted signal. The least significant bit (C[0]) of each code word (C[0:9]) is the first to be transmitted.

In the active data mode of transmitter 32, each transmitted code word C[0:9] is one of the words RLL, and thus the transmitted data stream is a run length limited ("RLIL") code word sequence that includes no run of length in excess of the predetermined value. Typically, an RLL code word sequence generated in this manner (in response to a sequence of many input data words) includes many Min words and many Max words, although fewer Max words than Min words.

Transmitter 32 also includes encoding logic 36 which is coupled to receive a sequence of control bit words. Each control bit word ("CONTROL") consists of two bits (e.g., the above-referenced control bits CTL0 and CTL1, or CTL2 and CTL3). In response to each two-bit control word, logic 36 generates a transition-maximized, 10 bit code word ("MAX") in accordance with the TMDS algorithm, and asserts each code word MAX to a second input of multiplexer 37. In a mode in which the control bit DE satisfies DE=0, multiplexer 37 passes through to serializer 38 the sequence of 10-bit MAX words received from logic 36, rather than the RLL words received from circuitry 35.

In preferred embodiments, transmitter 32 is operable in either of two modes, depending on the value of a control bit CTRL asserted thereto. In one such mode, circuitry 32 and 34 encodes data D[0:7] in accordance with the TMDS encoding algorithm to generate a sequence of Min words CMIN, and RLL logic circuitry 35 passes through the Min words CMIN to multiplexer 37. In this mode, RLL logic circuitry 35 does not calculate run length and does not substitute Max words for selected ones of the Min words CMIN, and the sequence of code word bits C[0:9] transmitted from serializer 38 (when DE=1) can include a run of length in excess of the predetermined value. In response to a second value of the control bit CTRL, RLL logic circuitry 35 operates in another mode, namely the above-described mode in which it substitutes Max words CMAX for selected ones of the Min words CMIN such that the sequence of code word bits C[0:9] transmitted from serializer 38 (when DE=1) is an RLL code word sequence that includes no run of length in excess of the predetermined value.

In a typical implementation, RLL logic circuitry 35 is configured to determine whether the current candidate Min word CMIN, concatenated with bits of the code word RLL most recently asserted to multiplexer 37 (the "previous" word RLL), includes a run of excessive length. For example, in one implementation RLL logic circuitry 35 is configured to determine whether the least significant bit ("LSB") of the current candidate Min word CMIN has the same polarity as the most significant bit ("MSB") of the previous word RLL, and to determine whether the N most significant bits of the previous word RLL are identical, where 'N' is an integer that is a predetermined threshold value (e.g., N=6). If logic circuitry 35 determines that the LSB of the current candidate Min word CMIN has the same polarity as the MSB of the previous word RLL and the N most significant bits of the previous word RLL are identical, then the previous RLL word concatenated with the current candidate Min word CMIN has a run length that exceeds N. In this case logic circuitry 35 asserts to multiplexer 37 the current Max word CMAX (in place of the corresponding current candidate Min word CMIN). If circuitry 35 determines that the LSB of the current candidate Min word CMIN does not have the same polarity as the MSB of the previous word RLL, or that the N most significant bits of the previous word RLL are not identical, then logic circuitry 35 asserts the current candidate Min word CMIN to multiplexer 37 (rather than the corresponding current Max word CMAX).

In other implementations, logic circuitry 35 is configured to identify excessive run length in accordance with a more sophisticated algorithm, e.g., an algorithm that allows longer average run length in the stream of code words RLL asserted to multiplexer 37. For example, in one such implementation logic circuitry 35 counts multiple leading bits of the current word CMIN as well as multiple trailing bits of the previous word RLL. More specifically, in response to determining that the LSB of the current word CMIN has the same polarity as the MSB of the previous word RLL and that the M least significant bits of the current word CMIN are identical and the N most significant bits of the previous word RLL are identical (where "M" and "N" are integers, and "M" is greater than one), logic circuitry 35 asserts to multiplexer 37 the current word CMAX in place of the corresponding current word CMIN. If circuitry 35 determines that the LSB of the current word CMIN does not have the same polarity as the MSB of the previous word RLL, or that the N most significant bits of the previous word RLL are not identical, or that the M least significant bits of the current word CMIN are not identical, then logic circuitry 35 asserts the current word CMIN to multiplexer 37 rather than the corresponding current word CMAX. With this implementation of circuitry 35, transmitter 32 allows longer maximum run length (M+N−1) than does transmitter 32 with circuitry 35 implemented as described in the previous paragraph (which allows maximum run length of N) assuming that N has the same value in both cases. Embodiments allowing longer maximum run length insert Max words less frequently into the stream of code words RLL during encoding of input data words D[0:7].

Only some of the elements of transmitter 32 are shown in FIG. 2. Transmitter 32 would typically include other conventional circuitry (not shown). All the elements of transmitter 32 shown in FIG. 2 belong to a block of circuitry (corresponding to block 2 of FIG. 1) for encoding one input data stream and serializing and transmitting the code words for that input data stream. Typical implementations of transmitter 32 would also include additional circuitry (corresponding to blocks 4 and 6 of FIG. 1) for encoding two additional input data streams, and serializing and transmitting (over cable 23) the code words for each additional input data stream.

Receiver 3 of FIG. 2 is a conventional DVI receiver. Only some elements of receiver 3 are shown in FIG. 2, and receiver 3 would typically include other conventional circuitry (not shown). All the elements of receiver 3 shown in FIG. 2 are elements of a subsystem (corresponding to block 8 of FIG. 1) for deserializing and decoding one stream of encoded data that has propagated to receiver 3 over cable 23. Typical implementations of receiver 3 would also include additional circuitry (corresponding to blocks 10 and 12 of FIG. 1) for deserializing and decoding two additional streams of encoded data that have propagated to receiver 3 over cable 23.

With reference to FIG. 2, in response to each sequence of ten code word bits C[0:9] transmitted from transmitter 32, deserializer 40 of receiver 3 asserts the code word bits C[0:9] (in parallel) to both decoding logic 41 and decoding logic 42. Without knowledge of whether the code word C[0:9] was transmitted during an active data period (when DE=1) or at a time (when DE=0) between active data periods, logic 42 performs conventional TMDS decoding on the word C[0:9] to generate a control bit pair (using circuitry that assumes that the word C[0:9] is a transition-maximized TMDS code character word indicative of a pair of control bits). Also without knowledge of whether the word C[0:9] was transmitted during an active data period (when DE=1) or at a time (when DE=0) between active data periods, logic 41 performs conventional TMDS decoding on the word C[0:9] to generate an 8-bit recovered data word (using circuitry that assumes that the word C[0:9] is a transition-minimized TMDS code word indicative of an input data word D[0:7]). Logic 41 includes conventional XNOR gates and XOR gates for use in the conventional TMDS decoding.

When DE=1, the 8-bit decoded word output from logic circuitry 41 is selected for further processing by circuitry (not shown) within receiver 3. When DE=0, the output of logic 41 is not selected, and instead the 2-bit control bit pair output from logic 42 is selected for further processing by circuitry (not shown) within receiver 3.

Each word RLL generated by logic circuitry 35 (of transmitter 32) when DE=1 is either a Max word CMAX or a corresponding Min word CMIN, and the bit patterns of each word CMAX and the corresponding word CMIN have been selected so that they will be decoded to the same input word D[0:7] by a conventional TMDS decoder. Since each word C[0:9] transmitted when DE=1 is one such word RLL, conventional TMDS decoding logic 41 performs conventional TMDS decoding on the word C[0:9] to recover the original input word D[0:7] regardless of whether the word RLL is a Max word CMAX or a Min word CMIN corresponding to the Max word CMAX. In other words, decoding logic 41 generates the correct decoded data regardless of whether each received code word is transition minimized or not.

Figure 3:
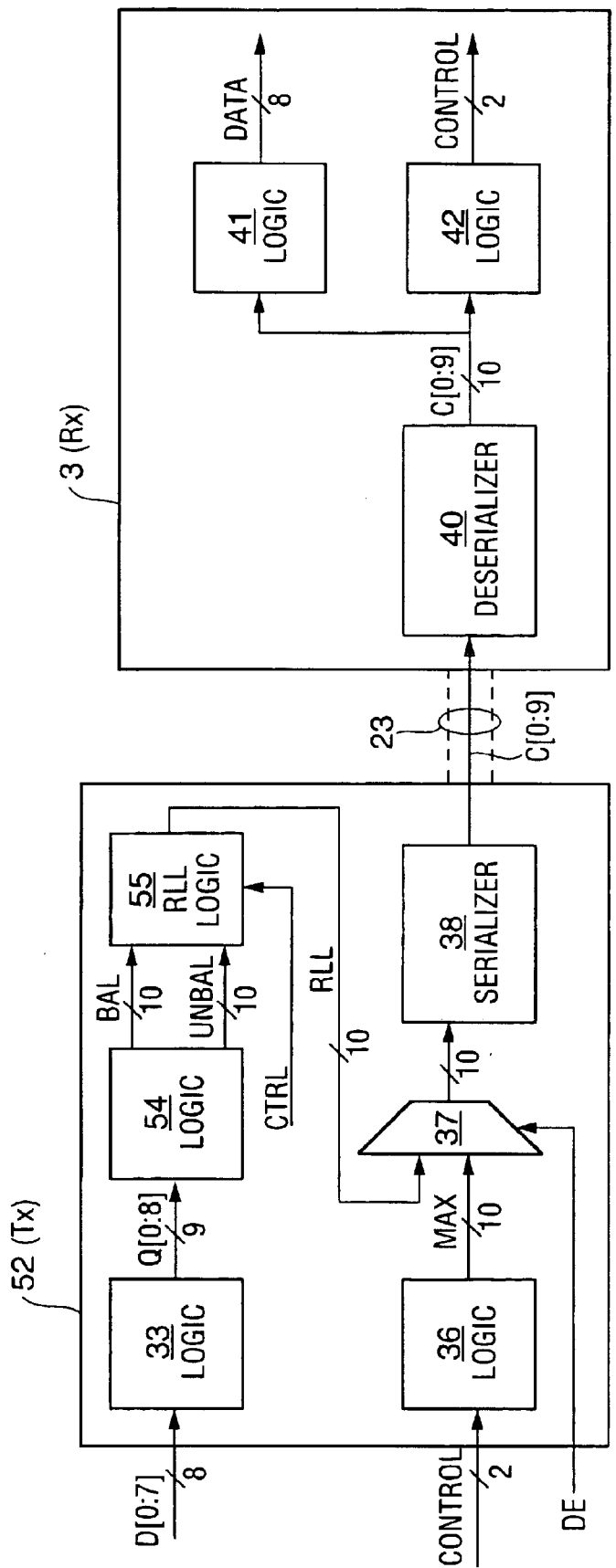
FIG. 3 is a block diagram of another embodiment of the inventive system.

We next describe another embodiment of the invention with reference to FIG. 3. In the FIG. 3 system, transmitter 52 is configured to transmit data to receiver 3 over a serial link. Receiver 3 is a conventional receiver identical to receiver 3 of FIG. 2. Cable 23 of FIG. 3 is identical to cable 23 of FIG. 2.

Within transmitter 52, conventional logic circuitry 33 encodes each 8-bit input data word D[0:7] as a 9-bit word, Q[0:8]. Each word D[0:7] can be, for example, one of the input words "BLU[7:0]" of FIG. 1. Circuitry 33 is configured to perform a first stage of encoding each input word D[0:7] in accordance with the conventional TMDS encoding algorithm to generate the word Q[0:8] by performing exclusive OR operations (or exclusive NOR operations) on the input word bits, with the choice between exclusive OR operations or exclusive NOR operations depending on the number of "1" bits of the input word and on the value of its least-significant bit, D[0].

Logic circuitry 33, 54, and 55 are operable to encode a sequence of input words D[0:7] as a DC-balanced sequence of Min words (including Min words and complemented Min words, each complemented Min word having a subset of bits that is the complement of a corresponding subset of a corresponding one of the Min words) unless the resulting sequence of code word bits RLL would have a run length that exceeds a predetermined value.

Specifically, logic circuitry 54 is configured to generate a conventional 10-bit, transition-minimized TMDS code word "BAL"(in accordance with the conventional TMDS encoding algorithm) in response to each word Q[0:8]. The word "BAL" will sometimes be referred to herein as a candidate "DC balancing" Min word. In response to the current word Q[0:8], logic 54 generates the current word "BAL" such that the current word BAL concatenated with the previously generated sequence of words BAL has correct DC balancing. Logic circuitry 54 is also configured to generate a 10-bit, transition-minimized TMDS code word "UNBAL" (in accordance with the invention) in response to each word Q[0:8]. The word "UNBAL" will sometimes be referred to herein as a "DC unbalancing" Min word. The eight least significant bits (LSBs) of each word UNBAL are the complements of the eight LSBs of the corresponding word BAL. Thus, concatenation of a code word UNBAL to a previously generated sequence of words BAL will not improve the DC balancing of the signal indicative of the resulting concatenation of the word UNBAL and words BAL. The most significant bit, BAL[9], of candidate DC balancing word BAL indicates whether the eight LSB, BAL[0:7], of BAL have or have not been inverted in accordance with a DC balancing algorithm. The next most significant bit, BAL[8], of candidate DC balancing word BAL indicates whether exclusive OR operations (or exclusive NOR operations) should be performed on bits BAL[0:7] (or the complements of bits BAL[0:7]) to decode these bits to recover the original input word D[0:7]. Similarly, the most significant bit, UNBAL[9], of the DC unbalancing word UNBAL indicates whether the eight LSBs, UNBAL[0:7], of UNBAL have or have not been inverted in accordance with a DC balancing algorithm. The next most significant bit, UNBAL[8], of DC unbalancing word UNBAL indicates whether exclusive OR operations (or exclusive NOR operations) should be performed on bits UNBAL[0:7] (or the complements of bits UNBAL[0:7]) to decode these bits to recover the original input word D[0:7].

RLL logic circuitry 55 receives each pair of words (candidate DC balancing word BAL and the corresponding DC unbalancing word UNBAL) generated by logic circuitry 54 in response to each word Q[0:8], and passes on a selected one of these words (identified as "RLL" in FIG. 3) to a first input of multiplexer 37. RLL logic circuitry 55 is configured to determine whether the encoded data stream previously asserted therefrom to multiplexer 37 (the sequence of word RLL previously asserted from circuitry 55 to multiplexer 37) would have a run length that exceeds a predetermined value if the candidate DC balancing word BAL were concatenated therewith. Upon determining that the previously asserted encoded data stream, concatenated with the candidate DC balancing word BAL, would not have a run length exceeding the predetermined value, circuitry 55 selects the candidate DC balancing word BAL as the current RLL word, and passes this word on to the first input of multiplexer 37. Upon determining that the previously asserted encoded data stream, concatenated with the candidate DC balancing word BAL, would have a run length that exceeds the predetermined value, circuitry 55 selects the DC unbalancing word UNBAL as the current RLL word and passes this word on to the first input of multiplexer 37.

In an active data mode (in which the control bit DE asserted to multiplexer 37 satisfies DE=1), multiplexer 37 passes through to serializer 38 the sequence of 10-bit RLL words it receives from circuitry 55. Serializer 38 serializes the bits of the words RLL and serially transmits (over one channel of cable 23) to receiver 3 a signal indicative of the serialized bits. Because the signal transmitted from serializer 38 can be indicative of different code words in different operating modes of transmitter 52, we denote as C[0:9] the code words determined by the transmitted signal. The least significant bit (C[0]) of each code word C[0:9] is the first to be transmitted. Thus, in the active data mode, the LSB of each word RLL is the first bit of such word to be transmitted.

Because each code word C[0:9] transmitted by transmitter 52 in the active data mode is one of the words RLL, the data stream transmitted in the active data mode is a run length limited ("RLL") code word sequence that includes no run of length in excess of the predetermined value. Typically, an RLL code word sequence transmitted in this manner (in response to a sequence of many input data words) includes many DC balancing words and many DC unbalancing words, although fewer DC unbalancing words than DC balancing words.

Transmitter 52 also includes encoding logic 36 which is identical to encoding logic 36 of FIG. 2 (within transmitter 32). In response to each two-bit control bit word "CONTROL" asserted to transmitter 52, logic 36 generates a transition-maximized, 10-bit code word ("MAX") in accordance with the TMDS algorithm and asserts each code word MAX to a second input of multiplexer 37. When the control bit DE satisfies DE=0, multiplexer 37 passes through to serializer 38 the sequence of 10-bit MAX words received from logic 36, rather than the RLL words received from circuitry 55.

In a typical implementation, RLL logic circuitry 55 is configured to determine whether the current candidate DC balancing word BAL, concatenated with bits of the code word RLL most recently asserted to multiplexer 37 (the "previous" word RLL), includes a run of excessive length. For example, in one implementation, RLL logic 55 is configured to determine whether the least significant bit ("LSB") of the current candidate DC balancing word BAL has the same polarity as the most significant bit ("MSB") of the previous word RLL, and whether the N most significant bits of the previous word RLL are identical, where 'N' is an integer that is a predetermined threshold value (e.g., N=6). If RLL logic 55 determines that the LSB of the current candidate word BAL has the same polarity as the MSB of the previous word RLL, and the N most significant bits of the previous word RLL are identical, then the previous RLL word concatenated with the current candidate word BAL has a run length that exceeds N. In this case logic 55 asserts to multiplexer 37 the current DC unbalancing word UNBAL (in place of the corresponding current candidate word BAL). If logic 55 determines that the LSB of the current candidate word BAL does not have the same polarity as the MSB of the previous word RLL, or that the N most significant bits of the previous word RLL are not identical, then logic 55 asserts the current candidate word BAL to multiplexer 37 (rather than the corresponding current DC unbalancing word UNBAL).

In other implementations, logic circuitry 55 is configured to identify excessive run length in accordance with a more sophisticated algorithm that allows longer average run length in the stream of code words RLL asserted to multiplexer 37. For example, in one such implementation logic circuitry 55 counts multiple leading bits of the current word BAL as well as multiple trailing bits of the previous word RLL. More specifically, in response to determining that the LSB of the current word BAL has the same polarity as the MSB of the previous word RLL and that the M least significant bits of the current word BAL are identical and the N most significant bits of the previous word RLL are identical (where "M" and "N" are integers, and "M" is greater than one), logic circuitry 55 asserts to multiplexer 37 the current word UNBAL in place of the corresponding current word BAL. If circuitry 55 determines that the LSB of the current word BAL does not have the same polarity as the MSB of the previous word RLL, or that the N most significant bits of the previous word RLL are not identical, or that the M least significant bits of the current word BAL are not identical, then circuitry 55 asserts the current word BAL to multiplexer 37 rather than the corresponding current word UNBAL. With this implementation of circuitry 55, transmitter 52 allows longer maximum run length (M+N−1) than does transmitter 52 with circuitry 55 implemented as described in the previous paragraph (which allows maximum run length of N) assuming that N has the same value in both cases. The embodiment allowing longer maximum run length inserts DC unbalancing words less frequently into the stream of code words RLL during encoding of input data words D[0:7].

Only some of the elements of transmitter 52 are shown in FIG. 3. Transmitter 52 would typically include other conventional circuitry (not shown). All the elements of transmitter 52 shown in FIG. 3 belong to a block of circuitry (corresponding to block 2 of FIG. 1) for encoding one input data stream and serializing and transmitting the code words for that input data stream. Typical implementations of transmitter 52 would also include additional circuitry (corresponding to blocks 4 and 6 of FIG. 1) for encoding two additional input data streams, and serializing and transmitting (over cable 23) the code words for each additional input data stream.

Receiver 3 of FIG. 3 is a conventional DVI receiver that is identical to receiver 3 of FIG. 3. The foregoing description of receiver 3 will not be repeated with reference to FIG. 3.

Recall that each word RLL, generated by logic circuitry 55 (of transmitter 52) during an active data period (when DE=1), is a Min word whose eight least significant bits have either correct polarity for DC balancing or the inverse of such polarity. Regardless of whether the RLL word's eight least significant bits have correct or incorrect polarity, RLL word's MSB indicates the polarity of the eight LSBs (i.e., it indicates whether or not the eight LSBs of the RLL word were or were not inverted during encoding. Since each word C[0:9] transmitted when DE=1 is one such word RLL, conventional TMDS decoding logic 41 performs conventional TMDS decoding on the word C[0:9] (including by inverting or not inverting the eight LSBs depending on the value of the MSB, regardless of whether the eight LSBs have correct or incorrect polarity for DC balancing) to recover the original input word D[0:7], regardless of whether the eight LSBs of the word C[0:9] have correct or incorrect polarity for DC balancing.

Transmitter 52's substitution of DC unbalancing Min words for conventionally determined Min words (whose eight LSBs have correct polarity for DC balancing) is implemented by logic circuitry 54 and 55 as described. In the transmitted RLL code word sequence, either a DC balancing Min word or a DC unbalancing Min word is indicative of each input word D[0:7].

In typical embodiments, RLL code word sequences generated in accordance with the invention are transmitted during active data periods (e.g., intervals in which a data enable signal, "DE," is high). At other times (e.g., when DE is low), code words ("control characters") indicative of control bits are transmitted but RLL code word sequences are not transmitted. Examples of such control characters are the four transition-maximized TMDS control characters generated during conventional TMDS encoding. In some such embodiments, it is possible that an RLL code word sequence transmitted during an active data period could include a pattern that matches a control character, and that some receivers could misinterpret the pattern as a control character.

In DVI systems and some other systems with serial links, a control character performs two functions: it provides byte boundary information; and is indicative of at least one control bit per channel (Hsync and Vsync for channel 0, CTL0 and CTL1 for channel 1, and CTL2 and CTL3 for channel 2, in DVI systems). In a DVI system, a receiver does not identify a byte boundary unless it detects the repeated occurrence of a control character during three consecutive clock cycles. In some implementations of the invention in which an RLL code word sequence is generated by inserting Max words in a Min word stream, and at least some of the Max words are identical to conventionally used control characters, it is extremely unlikely that more than two Max words will appear consecutively in the RLL sequence (insertion of more than two consecutive Max words are never, or almost never, required for run-length limiting).

However, in receivers of DVI systems (and some other systems), each channel identifies a set of control bits (each set consisting of one or more control bits) in response to detecting the occurrence of a single control character. When implementing the invention in DVI systems (and other systems) in which RLL code word sequences generated in accordance with the invention are transmitted during active data periods (e.g., when DE is high) but not during other periods (e.g., when DE is low) in which control characters transmitted, there are a variety of ways to ensure that a receiver (e.g., a legacy receiver designed for use with a conventional transmitter that is similar to the inventive transmitter but does not generate RLL code word sequences in accordance with the invention for transmission during active data periods) does not misinterpret a pattern in a transmitted RLL code word sequence as a control character indicative of a set of control bits. For example, if the transmitter of the inventive system generates RLL code word sequences by inserting Max words in Min word streams, the transmitter can be implemented to insert only Max words that are not recognizable by the receiver as control characters. Or, the transmitter can be implemented can be implemented to generate RLL code word sequences by inserting DC unbalancing Min words (but not Max words) in streams of DC balancing Min words, in cases in which the receiver interprets only Max words as control characters. Or, the receiver can be designed to be insensitive (e.g., a conventional receiver can be slightly modified to be insensitive) to control bit transitions that occur in active data periods.

Alternatively, when it is desired to use a transmitter to generate and transmit a RLL code word sequence (that can include unintentionally-occurring control character patterns) during active data periods in accordance with the invention to a receiver that may or may not be insensitive to control bit transitions during active data periods, the transmitter can be implemented in accordance with preferred embodiments of the invention to be capable of ascertaining whether the receiver is insensitive to control bit transitions during active data periods. In response to determining that the receiver is insensitive to control bit transitions during active data periods, the transmitter would operate in a mode in which it generates and transmits such a RLL code word sequence to the receiver in accordance with the invention. In response to determining that the receiver is sensitive to control bit transitions during active data periods, the transmitter would operate in a mode in which it generates and transmits conventionally encoded data (rather than a RLL code word sequence) to the receiver during active data periods.

In the case that RLL code word sequences are generated in accordance with the invention by inserting DC unbalancing Min words (and/or Max words) in streams of DC balancing Min words for transmission during active data periods (but not during other periods in which control characters transmitted), it is also possible that an RLL code word sequence transmitted during an active data period could include a pattern that matches a control character because part of a DC unbalancing Min word (or part of a Max word) concatenated with part of the next (or previous) DC balancing Min word matches the control character. Some receivers (e.g., conventional DVI receivers) could misinterpret such a pattern as a control character, especially in cases in which there are bit errors in the received data stream (some conventional receivers are implemented so that they do not interpret a pattern that is not a properly aligned word as a control character, and so would not be subject to the control character misinterpretation risk in the absence of bit errors in the received stream). There are a variety of ways to ensure that a receiver does not misinterpret a pattern of the described type as a control character. For example, the transmitter can be used only with receivers that are designed to be insensitive (e.g., conventional receivers that have been slightly modified to be insensitive) to control bit transitions that occur in active data periods. Or, the transmitter can be implemented to be capable of ascertaining whether the receiver is insensitive to control bit transitions during active data periods. In the latter case, in response to determining that the receiver is insensitive to control bit transitions during active data periods, the transmitter would operate in a mode in which it generates and transmits such a RLL code word sequence to the receiver in accordance with the invention, and in response to determining that the receiver is sensitive to control bit transitions during active data periods, the transmitter would operate in a mode in which it generates and transmits conventionally encoded data (rather than a RLL code word sequence) to the receiver during active data periods.

For example, transmitter 32 or 52 can be implemented to ascertain whether receiver 3 is insensitive to control bit transitions during active data periods via signals transmitted over a Display Data Channel ("DDC") line of cable 23. In response to determining that receiver 3 is insensitive to control bit transitions during active data periods, the transmitter would operate in a mode in which it generates and transmits (during active data periods) RLL code word sequences to receiver 3 in accordance with the invention. In response to determining that receiver 3 is sensitive to control bit transitions during active data periods, the transmitter would operate in a mode in which it generates and transmits conventionally encoded data (rather than a RLL code word sequence) to the receiver during active data periods.

Figure 4:
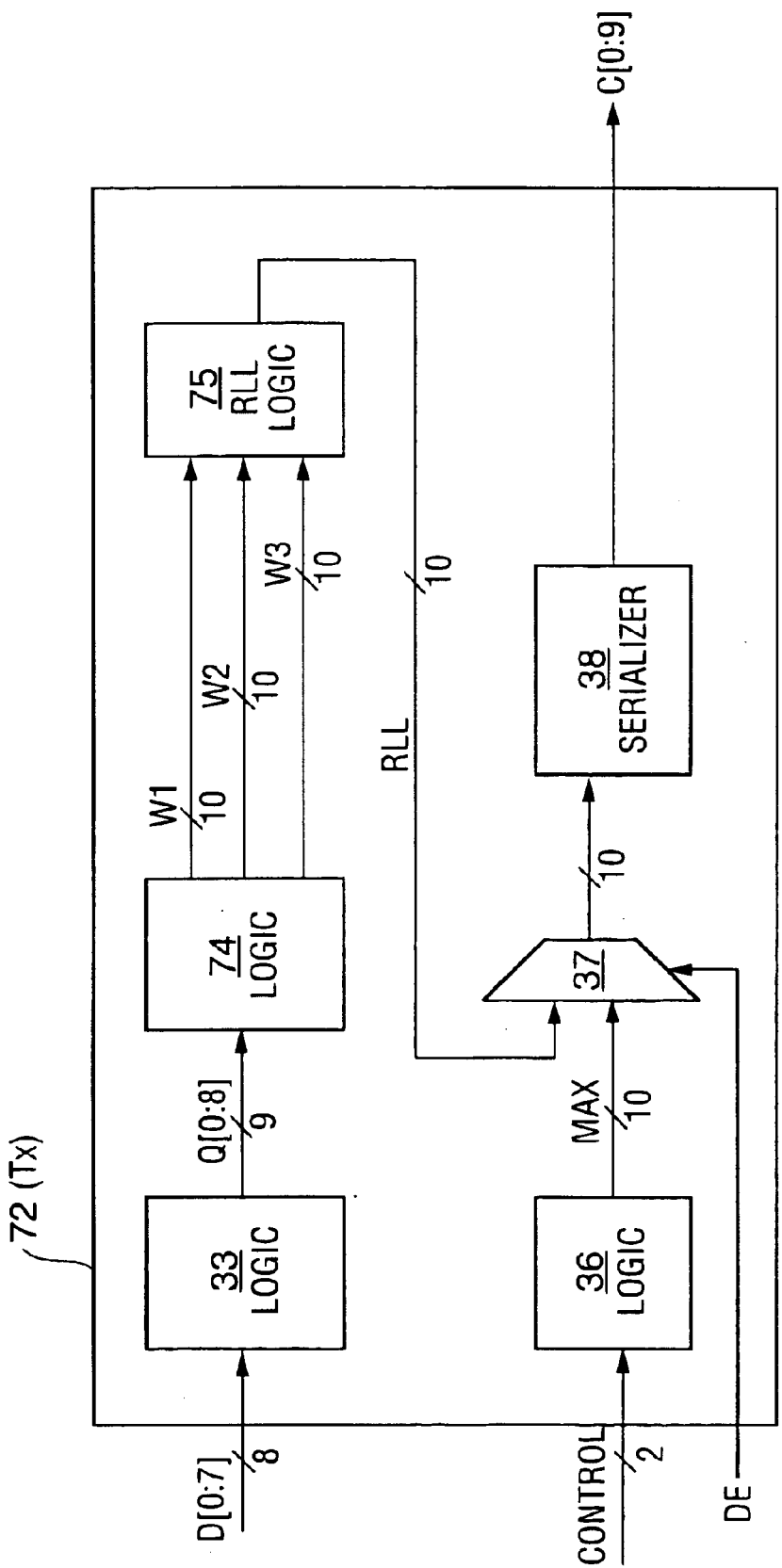
FIG. 4 is a block diagram of an alternative embodiment of the inventive transmitter.

We next describe another embodiment of the invention with reference to FIG. 4. Transmitter 72 of FIG. 4 is configured to transmit data to a receiver (e.g., receiver 3 of FIG. 3) over a serial link. Elements of transmitter 72 that are identical to corresponding elements of transmitter 52 of FIG. 3 are identified by the same reference numerals in FIGS. 3 and 4. The foregoing description of these elements will not be repeated with reference to FIG. 3. Transmitter 72 differs from transmitter 52 in that the RLL code word sequences that it generates include "DC unbalancing" and "DC balancing" Min words, and also Max words.

Logic circuitry 74 is configured to generate a conventional 10-bit, transition-minimized TMDS code word "W1" (a candidate "DC balancing" Min word) and a 10-bit, transition-minimized TMDS code word "W2" (a candidate "DC unbalancing" Min word) in response to each word Q[0:8], in the same manner that logic 54 of FIG. 3 would generate Min words BAL and UNBAL in response to the same word Q[0:8]. In response to the current word Q[0:8], logic 74 also generates a 10-bit, transition-maximized TMDS code word "W3" in response to each word Q[0:8], in the same manner that logic 34 of FIG. 2 would generate the Max word CMAX in response to the same word Q[0:8]. Logic circuitry 74 preferably generates a trio of words W1, W2, and W3 in response to each word Q[0:8] such that, if a conventional TMDS decoder performs conventional TMDS decoding on any of the words W1, W2, and W3, the decoder will recover the same input word D[0:7]. RLL logic circuitry 75 receives each trio of words W1, W2, and W3 generated by logic circuitry 74 in response to each word Q[0:8], and passes on a selected one of these words (identified as "RLL" in FIG. 3) to a first input of multiplexer 37.

Figure 5:
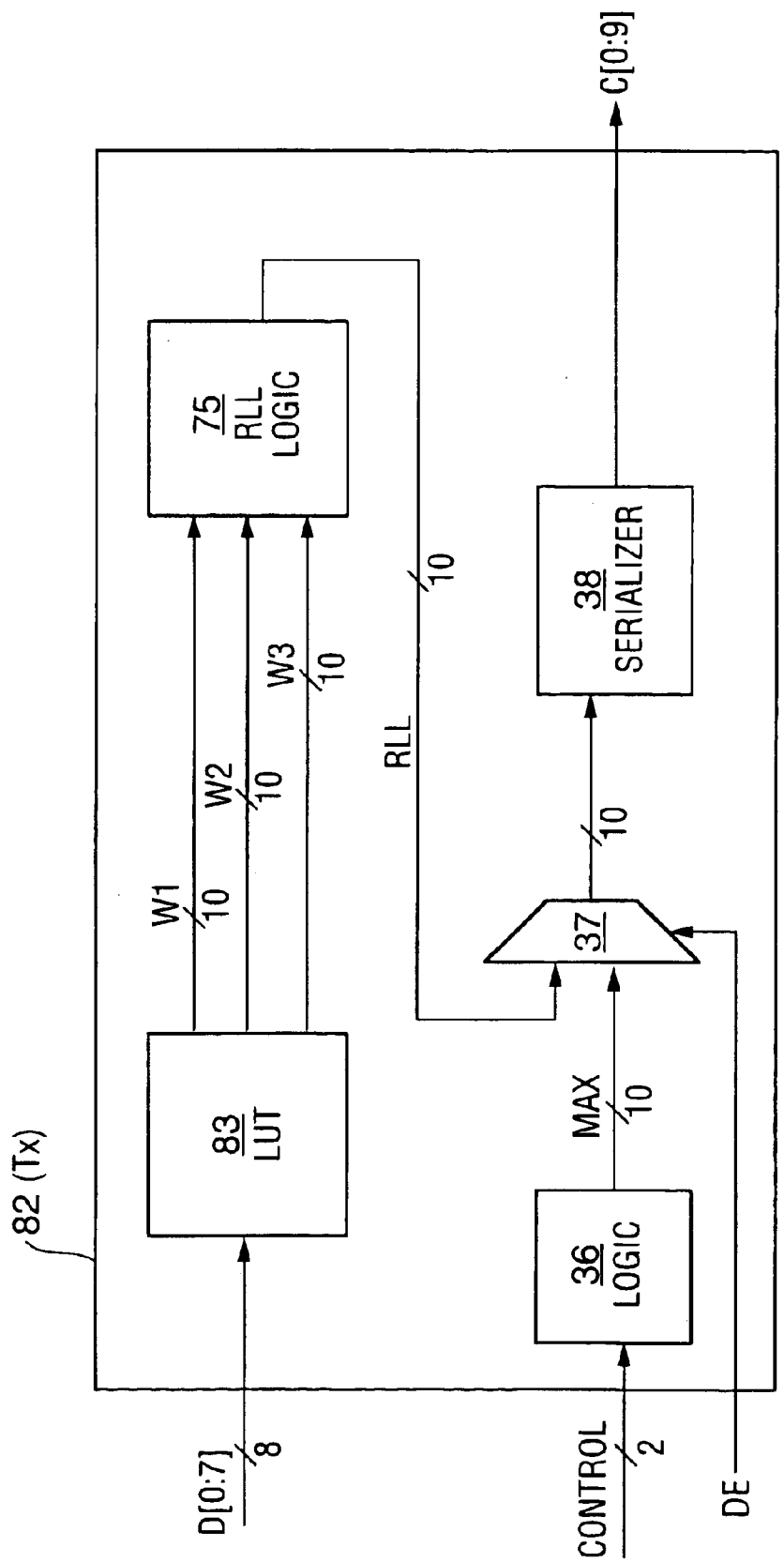
FIG. 5 is a block diagram of an alternative embodiment of the inventive transmitter.

In variations on the described embodiments, at least one look-up table (e.g., one implemented as a ROM) is employed to generate the candidate code words. Such look-up table(s) could implement transition control and dc balancing (e.g., as a replacement for logic circuitry 33 and 54 of FIG. 3, or logic circuitry 33 and 74 of FIG. 4) at the same time and produce all candidate code words. Subsequent logic could then select one of each set of candidate code words. For example, transmitter 82 of FIG. 5 (which embodies the invention) differs from transmitter 72 of FIG. 4 in that logic circuitry 33 and 74 (of FIG. 4) is replaced by look-up table ("LUT") circuitry 83 which performs the functions of circuitry 33 and 74. When implementing codes that have dependency to the previous data stream, some results of the encoded stream could be fed back to the ROM address generation circuitry.

A LUT-based embodiment of the invention can typically be implemented with a more regular design than a random logic-based embodiment. Advantages of random logic-based implementations of the invention include the following: they are typically more suitable for advanced fabrication technology where mask cost is high, they are typically easier to test (e.g., they require less test time), and they typically have simpler timing paths.

With reference again to FIG. 4, RLL logic circuitry 75 is configured to determine whether the encoded data stream previously asserted therefrom to multiplexer 37 (the sequence of word RLL previously asserted from circuitry 75 to multiplexer 37) would have a run length that exceeds a predetermined value if the candidate DC balancing word W1 were concatenated therewith. Upon determining that the previously asserted encoded data stream, concatenated with the candidate DC balancing word W1, would not have a run length exceeding the predetermined value, circuitry 75 selects the candidate DC balancing word W1 as the current RLL word, and passes this word on to the first input of multiplexer 37. Upon determining that the previously asserted encoded data stream, concatenated with the candidate DC balancing word W1, would have a run length that exceeds the predetermined value, circuitry 75 selects either the corresponding DC unbalancing word W2 or the corresponding Max word W3 as the current RLL word, and passes this word on to the first input of multiplexer 37.

RLL logic circuitry 75 is configured to determine the mix of DC balancing (inclusion of DC unbalancing Min words W2 in place of DC balancing Min words W1) and transition control (inclusion of Max words W3 in place of DC balancing Min words W1) in a manner appropriate (and preferably optimal) for the specific application. When mode conversion is critical, it is preferable to minimize the use of Max words (and to maximize the use of DC unbalancing Min words) in the transmitted RLL code word sequence. However, this would result in loose control of DC disparity. If maintaining DC level is important, the trade-off should be done in a different way.

It should be understood that while certain forms of the present invention are illustrated and described herein, the invention is defined by the claims and is not to be limited to the specific embodiments described and shown.

What is claimed is:

1. An encoder configured to receive a data word sequence of N-bit data words and to generate a code word sequence of M-bit code words by encoding the data words, where M>N, said encoder including:

candidate code word generation circuitry configured to generate an M-bit, transition-minimized, candidate code word in response to each N-bit data word of the data word sequence; and logic circuitry coupled to the candidate code word generation circuitry and configured to generate the code word sequence, including by determining whether a current candidate code word concatenated with at least one previously generated bit of the code word sequence includes a run of length in excess of a predetermined value, where the current candidate code word is one said candidate code word, to include the current candidate code word in the code word sequence in response to determining that the current candidate code word concatenated with said at least one previously generated bit of the code word sequence includes no run of length in excess of the predetermined value, and to include an M-bit substitute code word that corresponds to the current candidate code word in the code word sequence rather than the current candidate code word in response to determining that the current candidate code word concatenated with the at least one previously generated bit of the code word sequence includes a run of length in excess of the predetermined value, whereby the code word sequence is a run length limited code word sequence including no run of length in excess of the predetermined value.

2. The encoder of claim 1, wherein the candidate code word generation circuitry is configured to generate a candidate code word and at least one M-bit substitute code word that corresponds to the candidate code word in response to each data word of the data word sequence and to assert the most recently generated candidate code word and each substitute code word corresponding thereto to the logic circuitry, the current candidate code word is said most recently generated candidate code word, and the logic circuitry is configured to include in the code word sequence a substitute code word that corresponds to the most recently generated candidate code word, rather than the most recently generated candidate code word, in response to determining that the most recently generated candidate code word concatenated with the at least one previously generated bit of the code word sequence includes said run of length in excess of the predetermined value.

3. The encoder of claim 1, wherein each said substitute code word is a transition-maximized code word having more than a predetermined number of transitions between consecutive bits thereof, and each said candidate code word is a transition-minimized code word having less than the predetermined number of transitions between consecutive bits thereof.

4. The encoder of claim 1, wherein the candidate code word generation circuitry is configured to generate each candidate code word in accordance with a DC balancing algorithm such that each candidate code word is a DC balancing word and to generate one candidate code word and a corresponding DC unbalancing word in response to each data word of the data word sequence, each said DC unbalancing word is an M-bit, transition-minimized word including a bit sequence which is the complement of a corresponding bit sequence in the DC balancing word to which the DC unbalancing word corresponds, and each said substitute code word is one said DC unbalancing word.

5. The encoder of claim 1, wherein the code word sequence consists of transition-minimized code words and transition-maximized code words, each of the transition-minimized code words having less than a predetermined number of transitions between consecutive bits thereof, and each the transition-maximized code words having more than the predetermined number of transitions between consecutive bits thereof.

6. The encoder of claim 1, wherein each of the code words of the code word sequence is a transition-minimized code word having less than a predetermined number of transitions between consecutive bits thereof.

7. The encoder of claim 1, wherein the logic circuitry is configured to determine whether the current candidate code word concatenated with the X trailing bits of the code word sequence includes a run of length in excess of the predetermined value, where X is an integer.

8. The encoder of claim 1, wherein said predetermined value is an integer X, and the logic circuitry is configured to determine whether the leading bit of the current candidate code word matches the trailing bit of the code word sequence and whether the X trailing bits of the code word sequence are identical.

9. The encoder of claim 8, wherein the X trailing bits of the code word sequence are the X most significant bits of one of the code words of said code word sequence, and the leading bit of each candidate code word is the candidate code word's least significant bit.

10. The encoder of claim 1, wherein said predetermined value is an integer X+Y, and the logic circuitry is configured to determine whether the leading bit of the current candidate code word matches the trailing bit of the code word sequence, whether the X trailing bits of the code word sequence are identical and whether the Y leading bits of the current candidate code word are identical.

11. The encoder of claim 1, wherein the candidate code word generation circuitry includes at least one look-up table.

12. The encoder of claim 1, wherein the candidate code word generation circuitry is code word generation logic.

13. A transmitter configured to receive a data word sequence of N-bit data words, to generate a code word sequence of M-bit code words by encoding the data words, where M>N, and to transmit a signal indicative of the code word sequence over a serial link, said transmitter including:

candidate code word generation circuitry configured to generate an M-bit, transition-minimized, candidate code word in response to each N-bit data word of the data word sequence; and logic circuitry coupled to the candidate code word generation circuitry and configured to generate the code word sequence, including by determining whether a current candidate code word concatenated with at least one previously generated bit of the code word sequence includes a run of length in excess of a predetermined value, where the current candidate code word is one said candidate code word, to include the current candidate code word in the code word sequence in response to determining that the current candidate code word concatenated with said at least one previously generated bit of the code word sequence includes no run of length in excess of the predetermined value, and to include an M-bit substitute code word that corresponds to the current candidate code word in the code word sequence rather than the current candidate code word in response to determining that the current candidate code word concatenated with the at least one previously generated bit of the code word sequence includes a run of length in excess of the predetermined value, whereby the code word sequence is a run length limited code word sequence including no run of length in excess of the predetermined value.

14. The transmitter of claim 13, wherein the candidate code word generation circuitry is configured to generate a candidate code word and at least one M-bit substitute code word that corresponds to the candidate code word in response to each data word of the data word sequence and to assert the most recently generated candidate code word and each substitute code word corresponding thereto to the logic circuitry, the current candidate code word is said most recently generated candidate code word, and the logic circuitry is configured to include in the code word sequence a substitute code word that corresponds to the most recently generated candidate code word rather than the most recently generated candidate code word in response to determining that the most recently generated candidate code word concatenated with said at least one previously generated bit of the code word sequence includes said run of length in excess of the predetermined value.

15. The transmitter of claim 13, wherein each said substitute code word is a transition-maximized code word having more than a predetermined number of transitions between consecutive bits thereof, and each said candidate code word is a transition-minimized code word having less than the predetermined number of transitions between consecutive bits thereof.

16. The transmitter of claim 13, wherein the candidate code word generation circuitry is configured to generate each candidate code word in accordance with a DC balancing algorithm such that each candidate code word is a DC balancing word and to generate one candidate code word and a corresponding DC unbalancing word in response to each data word of the data word sequence, each said DC unbalancing word is an M-bit, transition-minimized word including a bit sequence which is the complement of a corresponding bit sequence in the DC balancing word to which the DC unbalancing word corresponds, and each said substitute code word is one said DC unbalancing word.

17. The transmitter of claim 13, wherein the code word sequence consists of transition-minimized code words and transition-maximized code words, each of the transition-minimized code words having less than a predetermined number of transitions between consecutive bits thereof, and each the transition-maximized code words having more than the predetermined number of transitions between consecutive bits thereof.

18. The transmitter of claim 13, wherein each of the code words of the code word sequence is a transition-minimized code word having less than a predetermined number of transitions between consecutive bits thereof.

19. The transmitter of claim 13, wherein the logic circuitry is configured to determine whether the current candidate code word concatenated with the X trailing bits of the code word sequence includes a run of length in excess of the predetermined value, where X is an integer.

20. The transmitter of claim 13, wherein said predetermined value is an integer X, and the logic circuitry is configured to determine whether the leading bit of the current candidate code word matches the trailing bit of the code word sequence and whether the X trailing bits of the code word sequence are identical.

21. The transmitter of claim 20, wherein the X trailing bits of the code word sequence are the X most significant bits of one of the code words of said code word sequence, and the leading bit of each candidate code word is the candidate code word's least significant bit.

22. The transmitter of claim 13, wherein said predetermined value is an integer X+Y, and the logic circuitry is configured to determine whether the leading bit of the current candidate code word matches the trailing bit of the code word sequence, whether the X trailing bits of the code word sequence are identical and whether the Y leading bits of the current candidate code word are identical.

23. The transmitter of claim 13, wherein the candidate code word generation circuitry includes at least one look-up table.

24. The transmitter of claim 13, wherein the candidate code word generation circuitry is code word generation logic.

25. A serial data transmission system, including:
a transmitter configured to receive a data word sequence of N-bit data words and to generate a code word sequence of M-bit code words by encoding the data words, where M>N;
a receiver coupled to receive a signal indicative of the code word sequence and configured to recover the data words from the signal including by decoding the code word sequence; and
a serial link between the transmitter and the receiver, wherein the transmitter is configured to generate the signal and to transmit said signal over the link to the receiver, said transmitter including:
candidate code word generation circuitry configured to generate an M-bit, transition-minimized, candidate code word in response to each N-bit data word of the data word sequence; and
logic circuitry coupled to the candidate code word generation circuitry and configured to generate the code word sequence, including by determining whether a current candidate code word concatenated with at least one previously generated bit of the code word sequence includes a run of length in excess of a predetermined value, where the current candidate code word is one said candidate code word, to include the current candidate code word in the code word sequence in response to determining that the current candidate code word concatenated with said at least one previously generated bit of the code word sequence includes no run of length in excess of the predetermined value, and to include an M-bit substitute code word that corresponds to the current candidate code word in the code word sequence rather than the current candidate code word in response to determining that the current candidate code word concatenated with the at least one previously generated bit of the code word sequence includes a run of length in excess of the predetermined value, whereby the code word sequence is a run length limited code word sequence including no run of length in excess of the predetermined value.

26. The system of claim 25, wherein the candidate code word generation circuitry is configured to generate a candidate code word and at least one M-bit substitute code word that corresponds to the candidate code word in response to each data word of the data word sequence and to assert the most recently generated candidate code word and each substitute code word corresponding thereto to the logic circuitry, the current candidate code word is said most recently generated candidate code word, and
the logic circuitry is configured to include in the code word sequence a substitute code word that corresponds to the most recently generated candidate code word rather than the most recently generated candidate code word in response to determining that the most recently generated candidate code word concatenated with said at least one previously generated bit of the code word sequence includes said run of length in excess of the predetermined value.

27. The system of claim 25, wherein each said substitute code word is a transition-maximized code word having more than a predetermined number of transitions between consecutive bits thereof, and each said candidate code word is a transition-minimized code word having less than the predetermined number of transitions between consecutive bits thereof.

28. The system of claim 25, wherein the candidate code word generation circuitry is configured to generate each candidate code word in accordance with a DC balancing algorithm such that each candidate code word is a DC balancing word and to generate one candidate code word and a corresponding DC unbalancing word in response to each data word of the data word sequence, each said DC unbalancing word is an M-bit, transition-minimized word including a bit sequence which is the complement of a corresponding bit sequence in the DC balancing word to which the DC unbalancing word corresponds, and each said substitute code word is one said DC unbalancing word.

29. The system of claim 25, wherein the code word sequence consists of transition-minimized code words and transition-maximized code words, each of the transition-minimized code words having less than a predetermined number of transitions between consecutive bits thereof, and each the transition-maximized code words having more than the predetermined number of transitions between consecutive bits thereof.

30. The system of claim 25, wherein each of the code words of the code word sequence is a transition-minimized code word having less than a predetermined number of transitions between consecutive bits thereof.

31. The system of claim 25, wherein the logic circuitry is configured to determine whether the current candidate code word concatenated with the X trailing bits of the code word sequence includes a run of length in excess of the predetermined value, where X is an integer.

32. The system of claim 25, wherein said predetermined value is an integer X, and the logic circuitry is configured to determine whether the leading bit of the current candidate code word matches the trailing bit of the code word sequence and whether the X trailing bits of the code word sequence are identical.

33. The system of claim 25, wherein said predetermined value is an integer X+Y, and the logic circuitry is configured to determine whether the leading bit of the current candidate code word matches the trailing bit of the code word sequence, whether the X trailing bits of the code word sequence are identical and whether the Y leading bits of the current candidate code word are identical.

34. The system of claim 25, wherein the candidate code word generation circuitry includes at least one look-up table.

35. The system of claim 25, wherein the candidate code word generation circuitry is code word generation logic.

36. A serial data transmission system, including:
 a serial link;
 a receiver coupled to the link and configured to receive a signal that has propagated over the link, wherein the signal is indicative of encoded data that have been generated by encoding data in accordance with a TMDS-like encoding algorithm having an inverse, and the receiver is configured to recover the data from the signal including by decoding the encoded data in accordance with the algorithm's inverse; and
 a transmitter coupled to the link and configured to generate a code word sequence of M-bit code words in response to a data word sequence of N-bit data words by encoding the data words in accordance with a modified version of the algorithm, where M>N, including by generating M-bit candidate code words in response to the data words in accordance with the algorithm, and substituting M-bit substitute code words for selected ones of the candidate words in accordance with the modified version of the algorithm such that the code word sequence is a run length limited code word sequence including no run of length in excess of a predetermined value,
 wherein the transmitter is configured to generate a run length limited signal indicative of the code word sequence and to transmit the run length limited signal over the link to the receiver, wherein the modified version of the algorithm is such that the receiver is capable of recovering the data words from the run length limited signal including by decoding the code word sequence in accordance with the inverse of the algorithm.

37. The system of claim 36, wherein each of the candidate code words is an M-bit, transition-minimized code word, and wherein the transmitter includes:
 logic circuitry configured to generate the code word sequence, including by determining whether a current candidate code word concatenated with at least one previously generated bit of the code word sequence includes a run of length in excess of the predetermined value, where the current candidate code word is one of the candidate code words, to include the current candidate code word in the code word sequence in response to determining that the current candidate code word concatenated with said at least one previously generated bit of the code word sequence includes no run of length in excess of the predetermined value, and to include one of the substitute code words that corresponds to the current candidate code word in the code word sequence rather than the current candidate code word in response to determining that the current candidate code word concatenated with the at least one previously generated bit of the code word sequence includes a run of length in excess of the predetermined value.

38. The system of claim 36, wherein the transmitter also includes:
 code word generation circuitry configured to generate a candidate code word and at least one substitute code word that corresponds to the candidate code word in response to each data word of the data word sequence and to assert the most recently generated candidate code word and each substitute code word corresponding thereto to the logic circuitry, the current candidate code word is said most recently generated candidate code word, and
 wherein the logic circuitry is configured to include in the code word sequence a substitute code word that corresponds to the most recently generated candidate code word rather than the most recently generated candidate code word in response to determining that the most recently generated candidate code word concatenated with said at least one previously generated bit of the code word sequence includes said run of length in excess of the predetermined value.

39. The system of claim 38, wherein the code word generation circuitry is configured to generate each candidate code word in accordance with a DC balancing algorithm such that each candidate code word is a DC balancing word and to generate one candidate code word and a corresponding DC unbalancing word in response to each data word of the data word sequence, each said DC unbalancing word is an M-bit, transition-minimized word including a bit sequence which is the complement of a corresponding bit sequence in the DC balancing word to which the DC unbalancing word corresponds, and each said substitute code word is one said DC unbalancing word.

40. The system of claim 38, wherein each said substitute code word is a transition-maximized code word having more than a predetermined number of transitions between consecutive bits thereof, and each said candidate code word is a transition-minimized code word having less than the predetermined number of transitions between consecutive bits thereof.

41. The system of claim 36, wherein the code word sequence consists of transition-minimized code words and transition-maximized code words, each of the transition-minimized code words having less than a predetermined number of transitions between consecutive bits thereof, and each the transition-maximized code words having more than the predetermined number of transitions between consecutive bits thereof.

42. The system of claim 36, wherein each of the code words of the code word sequence is a transition-minimized code word having less than a predetermined number of transitions between consecutive bits thereof.

43. A TMDS-like encoding method for generating a code word sequence of M-bit code words by encoding N-bit data words of a data word sequence, where M>N, said method including the steps of:
 (a) generating a sequence of candidate code words, including by generating an M-bit, transition-minimized candidate code word in response to each N-bit data word of the data word sequence; and (b) generating the code word sequence using the candidate code words, including by determining whether a current candidate code word concatenated with at least one previously generated bit of the code word sequence includes a run of length in excess of a predetermined value, including the current candidate code word in the code word sequence in response to determining that the current candidate code word concatenated with said at least one previously generated bit of the code word sequence includes no run of length in excess of the predetermined value, and including an M-bit substitute code word that corresponds to the current candidate code word in the code word sequence rather than the current candidate code word in response to determining that the current candidate code word concatenated with the at least one previously generated bit of the code word sequence includes a run of length in excess of the predetermined value, whereby the code word sequence is a run length limited code word sequence including no run of length in excess of the predetermined value.

44. The method of claim 43, wherein step (a) includes the step of:

in response to each data word of the data word sequence, generating at least one M-bit substitute code word that corresponds to the candidate code word generated in response to said data word.

45. The method of claim 44, wherein each candidate code word is a DC balancing word, and each substitute code word that corresponds to one said candidate code word is a transition-minimized DC unbalancing word including a bit sequence which is the complement of a corresponding bit sequence in the candidate code word to which the DC unbalancing word corresponds.

46. The method of claim 43, wherein each said substitute code word is a transition-maximized code word having more than a predetermined number of transitions between consecutive bits thereof, and each said candidate code word is a transition-minimized code word having less than the predetermined number of transitions between consecutive bits thereof.

47. The method of claim 43, wherein the current candidate code word is the most recently generated candidate code word.

48. A method for data transmission over a serial link to a receiver, wherein the receiver is configured to recover data from a signal that has propagated over the link to said receiver, the signal is indicative of encoded data that have been generated by encoding data in accordance with a TMDS-like encoding algorithm having an inverse, and the receiver is configured to recover the data from the signal including by decoding the encoded data in accordance with the algorithm's inverse, said method including the steps of:

(a) generating a code word sequence of M-bit code words by encoding N-bit data words of a data word sequence in accordance with a modified version of the algorithm, where M>N, including by generating M-bit, transition-minimized candidate code words in response to the data words in accordance with the algorithm and substituting M-bit substitute code words for selected ones of the candidate code words in accordance with the modified version of the algorithm such that the code word sequence is a run length limited code word sequence including no run of length in excess of a predetermined value; and (b) transmitting a run length limited signal indicative of the code word sequence over the link to the receiver, wherein the modified version of the algorithm is such that the receiver is capable of recovering the data words from the run length limited signal including by decoding the code word sequence in accordance with the inverse of the algorithm.

49. The method of claim 48, wherein step (a) includes the step of:

in response to each data word of the data word sequence, generating at least one M-bit substitute code word that corresponds to the candidate code word generated in response to said data word.

50. The method of claim 48, wherein each candidate code word is a DC balancing word, and each substitute code word that corresponds to one said candidate code word is a transition-minimized DC unbalancing word including a bit sequence which is the complement of a corresponding bit sequence in the candidate code word to which the DC unbalancing word corresponds.

51. The method of claim 48, wherein step (a) includes the steps of:

generating the code word sequence using the candidate code words, including by determining whether a current candidate code word concatenated with at least one previously generated bit of the code word sequence includes a run of length in excess of the predetermined value, including the current candidate code word in the code word sequence in response to determining that the current candidate code word concatenated with said at least one previously generated bit of the code word sequence includes no run of length in excess of the predetermined value, and including one said substitute code word that corresponds to the current candidate code word in the code word sequence rather than the current candidate code word in response to determining that the current candidate code word concatenated with the at least one previously generated bit of the code word sequence includes a run of length in excess of the predetermined value.

52. The method of claim 51, wherein the current candidate code word is the most recently generated candidate code word.

53. The method of claim 48, wherein each of the substitute code words is a transition-maximized code word having more than a predetermined number of transitions between consecutive bits thereof, and each said candidate code word is a transition-minimized code word having less than the predetermined number of transitions between consecutive bits thereof.

* * * * *